(12) United States Patent
Yuan

(10) Patent No.: US 10,797,083 B2
(45) Date of Patent: Oct. 6, 2020

(54) ARRAY SUBSTRATE WITH CONTACT HOLE HAVING HOLE WALLS FORMING AN OBTUSE ANGLE

(71) Applicant: SHENZHEN CHINA STAR OPTOELECTRONICS SEMICONDUCTOR DISPLAY TECHNOLOGY CO., LTD., Shenzhen, Guangdong (CN)

(72) Inventor: Wenhao Yuan, Guangdong (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 319 days.

(21) Appl. No.: 15/749,473

(22) PCT Filed: Jan. 4, 2018

(86) PCT No.: PCT/CN2018/071381
§ 371 (c)(1),
(2) Date: Jan. 31, 2018

(87) PCT Pub. No.: WO2019/127636
PCT Pub. Date: Jul. 4, 2019

(65) Prior Publication Data
US 2020/0091191 A1    Mar. 19, 2020

(30) Foreign Application Priority Data
Dec. 28, 2017    (CN) .......................... 2017 1 1461754

(51) Int. Cl.
*H01L 27/12*      (2006.01)
*H01L 21/768*    (2006.01)

(52) U.S. Cl.
CPC ........ *H01L 27/124* (2013.01); *H01L 21/7684* (2013.01); *H01L 27/1262* (2013.01)

(58) Field of Classification Search
CPC . H01L 21/7684; H01L 21/77; H01L 27/1214; H01L 27/124; H01L 27/1244; H01L 27/1248; H01L 27/1262
(Continued)

(56) References Cited

U.S. PATENT DOCUMENTS

| 2002/0075424 A1* | 6/2002 | Sakamoto ......... G02F 1/136227 349/43 |
| 2006/0290634 A1* | 12/2006 | Hwang ............... H01L 27/1248 345/92 |
| 2006/0290828 A1* | 12/2006 | Hwang ............... H01L 27/3244 349/43 |

FOREIGN PATENT DOCUMENTS

CN           104299942 A      1/2015

* cited by examiner

*Primary Examiner* — Duy T Nguyen
(74) *Attorney, Agent, or Firm* — Hemisphere Law, PLLC; Zhigang Ma

(57) ABSTRACT

The invention provides an array substrate and a method of making the same, wherein the array substrate includes: a base substrate; a metal layer formed on the base substrate; a passivation layer formed on the base substrate and the metal layer; a planarization layer formed on the passivation layer; a contact hole formed by etching the planarization layer and the passivation layer on the metal layer, to make the metal layer at least partially exposed by the contact hole, wherein a hole wall of the contact hole at the passivation layer is coplanar with the hole wall at the planarization layer or the hole wall of the contact hole at the passivation layer and the hole wall at the planarization layer form an obtuse angle; a continuous pixel electrode layer formed on the planarization (Continued)

layer and the contact hole, wherein the pixel electrode layer is connected to the metal layer.

2 Claims, 4 Drawing Sheets

(58) Field of Classification Search
USPC .......................................................... 257/774
See application file for complete search history.

ARRAY SUBSTRATE WITH CONTACT HOLE HAVING HOLE WALLS FORMING AN OBTUSE ANGLE

RELATED APPLICATIONS

The present application is a National Phase of International Application Number PCT/CN2018/071381, filed Jan. 4, 2018, and claims the priority of China Application No. 201711461754.7, filed Dec. 28, 2017.

FIELD OF THE DISCLOSURE

The disclosure relates to a panel display technical field, and more particularly to an array substrate and a method of making the same.

BACKGROUND

As the process in the Array section of the LCD panel, more and more uses the new application of COA (color filter on Array), POA (photo spacer on Array) And other new technologies, and is needing to introduce PFA (polymer film on array) process to prepare a planarization layer, optimizing the flatness of the film surface.

Referring to FIG. 1, a typical array substrate fabrication process is as follows: a metal layer 11' is first deposited on a base substrate 1', and a passivation layer 12' is formed on the base substrate 1' and the metal layer 11', a planarization layer 13' is further formed on the passivation layer 12', and a contact layer 15' is formed by etching the planarization layer 13' and the passivation layer 12'. The passivation layer 12' is usually made of material such as $SiN_x$. Since the etch rates of the planarization layer 13' and the passivation layer 12' are not the same, the etching rate of the planarization layer 13' is generally slower than that of the passivation layer 12', moreover, the planarization layer 13' formed by the PFA process is remained on the base substrate 1' after the etching, so that the edge of the planarization layer 13' after etching is more protruded than the edge of the passivation layer 12'. The wall of contact layer 15' is discontinuous, and eventually forms an undercut 10'.

Next, when depositing the pixel electrode layer 14', as shown in FIG. 2, since the undercut 10' is formed between the edge of the planarization layer 13' and the edge of the passivation layer 12', the pixel electrode layer 14' is easy to be cracked at the site.

SUMMARY

The technical problem to be solved by the present invention is to provide an array substrate and method of making the same, to prevent the deposited pixel electrode layer from breaking.

In order to solve the above technical problem, the present invention provides an array substrate, including:

A base substrate;
A metal layer formed on the base substrate;
A passivation layer formed on the base substrate and the metal layer;
A planarization layer formed on the passivation layer;
A contact hole formed by etching the planarization layer and the passivation layer on the metal layer, to make the metal layer at least partially exposed by the contact hole, wherein a hole wall of the contact hole at the passivation layer is coplanar with the hole wall at the planarization layer, or the hole wall of the contact hole at the passivation layer and the hole wall at the planarization layer form an obtuse angle; and A continuous pixel electrode layer formed on the planarization layer and the contact hole, wherein the pixel electrode layer is connected to the metal layer.

Wherein the hole wall of the contact hole at the passivation layer forms a step, and the step comprises a first hole wall parallel to the base substrate, and a second hole wall inclined from the first hole wall toward the metal layer and connected to the metal layer, the first hole wall and the hole wall of the contact hole at the planarization layer form the obtuse angle.

Wherein a material of the passivation layer is one of $SiN_x$, $SiO_x$ and $SiO_xN_y$.

The present invention also provides a method of making an array substrate, comprising:

Providing a base substrate;
Forming a metal layer, a passivation layer and a planarization layer on the base substrate sequentially;
Performing two-step etching to the planarization layer and the passivation layer on the metal layer to form a contact hole, to make the metal layer at least partially exposed by the contact hole, wherein a hole wall of the contact hole at the passivation layer is coplanar with the hole wall at the planarization layer, or the hole wall of the contact hole at the passivation layer and the hole wall at the planarization layer form an obtuse angle; and Forming a continuous pixel electrode layer on the planarization layer and the contact hole, wherein the pixel electrode layer is connected to the metal layer.

Wherein in the step of performing two-step etching to the planarization layer and the passivation layer on the metal layer, an etching rate selectivity of the planarization layer to the passivation layer in a first step is less than the etching rate selectivity of the planarization layer to the passivation layer in a second step, Wherein a range of the etching rate selectivity of the planarization layer to the passivation layer in the first step is [0.8, 1], the range of the etching rate selectivity of the planarization layer to the passivation layer in the second step is [1.8, 2].

Wherein by the two-step etching, a thickness ratio of an etched planarization layer and an etched passivation layer is 1.2 to 1.5.

Wherein the step of performing two-step etching to the planarization layer and the passivation layer on the metal layer further comprises: adjusting etching times of the first step or the second step according to a material of the planarization layer or a film quality of the passivation layer.

Wherein if a denser material is selected as the passivation layer, the etching time of the first step is increased, and if a material with a faster etching rate is selected as the planarization layer, the etching time of the second step is reduced.

Wherein if a looser material is selected as the passivation layer, the etching time of the first step is reduced, and if a material with a slower etching rate is selected as the planarization layer, the etching time of the second step is increased.

The present invention has the following beneficial effects: by performing two-step etching to the planarization layer and the passivation layer on the metal layer, to make the hole wall of the contact hole at the passivation layer and the hole wall at the planarization layer forming the obtuse angle, so as to solve the problem that the pixel electrode layer is cracked due to undercut in the conventional technology. On the basis of ensuring that the passivation layer at the contact hole is etched cleanly, a relatively small planarization layer is etched away to avoid the contamination caused by the contact of the RGB color resist and the liquid crystal; In addition, but also through the two-step etching time to deal with the different passivation film quality and the material of the planarization layer.

BRIEF DESCRIPTION OF THE DRAWINGS

To describe the technical solutions in the embodiments of the present invention or in the conventional technology more clearly, the following briefly introduces the accompanying drawings required for describing the embodiments or the conventional technology. Apparently, the accompanying drawings in the following description merely show some embodiments of the present invention. For those skilled in the art, other drawings may be obtained based on these drawings without any creative work.

DETAILED DESCRIPTION OF PREFERRED EMBODIMENTS

Figure 1:
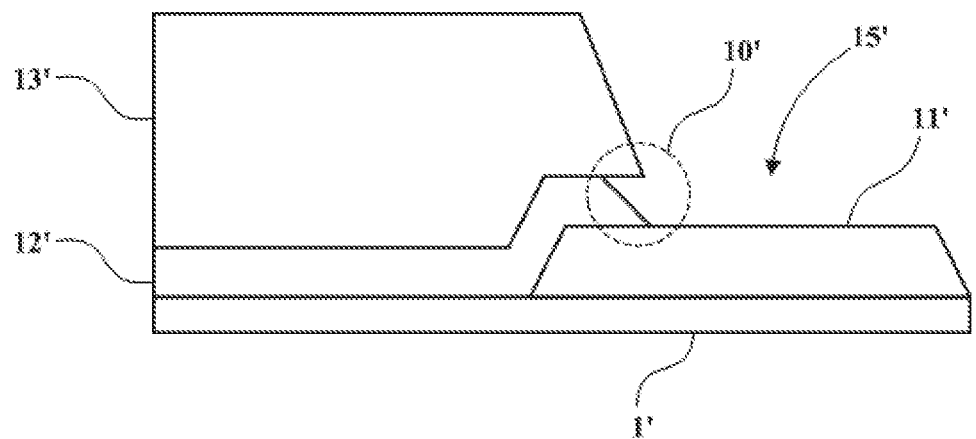
FIG. 1 is a schematic structural diagram of a conventional array substrate.
Figure 2:
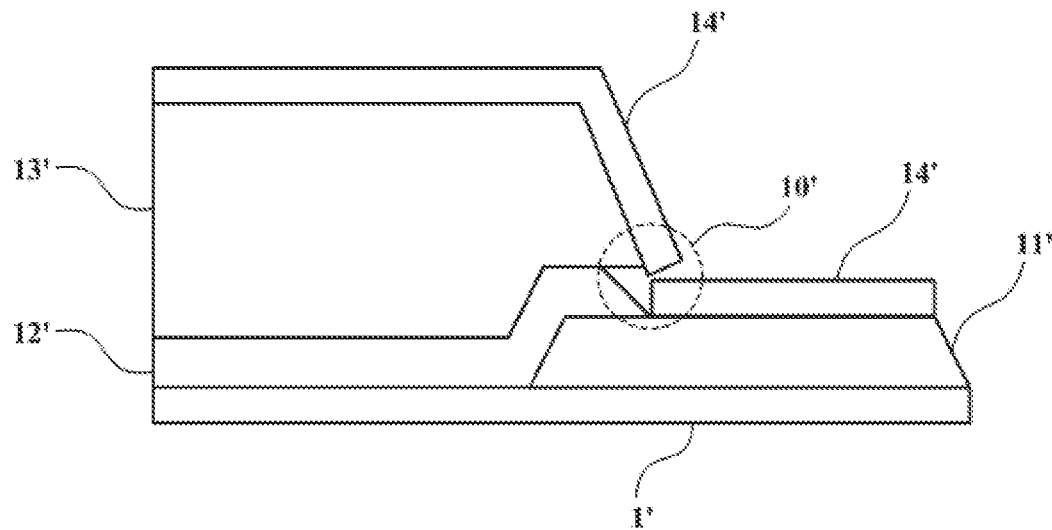
FIG. 2 is another schematic structural diagram of the conventional array substrate.

The following description of various embodiments is made with reference to the accompanying drawings to illustrate specific embodiments in which the invention may be practiced.

Referring to FIG. 3 to FIG. 7, an embodiment of the present invention provides an array substrate, which includes;

A base substrate 1;

A metal layer 11 formed on the base substrate 1;

A passivation layer 12 formed on the base substrate 1 and the metal layer 11;

A planarization layer 13 formed on the passivation layer 12;

A contact hole 15 formed by etching the planarization layer 13 and the passivation layer 12 on the metal layer 11, the metal layer 11 is at least partially exposed by the contact hole 15, a hole wall 120 of the contact hole 15 at the passivation layer 12 is coplanar with the hole wall 130 at the planarization layer 13 or forms an obtuse angle θ;

A continuous pixel electrode layer 14 formed on the planarization layer 13 and the contact hole 15, the pixel electrode layer 14 is connected to the metal layer 11.

Specifically, in this embodiment, during the etching of the planarization layer 13 and the passivation layer 12 on the metal layer 11, a stepwise etching method is adopted: the first step is to etch more of the passivation layer 12 and less planarization layer 13; a second step is to etch the remaining passivation layer 12 and the more planarization layer 13, so that the hole wall 130 of the contact hole 15 formed at the planarization layer 13 does not protrude from the hole wall 120 at the passivation layer 12, the front end of the hole wall 130 at the planarization layer 13 is not suspended and forms the undercut, but is coplanar with the hole wall 120 at the passivation layer 12, or the hole wall 130 and the the hole wall 120 form the obtuse angle θ. The pixel electrode layer 14 is then deposited on the planarization layer 13 and on the continuous wall of the hole along the contact hole 15 without undercutting in the conventional technology, so that no crack occurs. It is understandable that in the present embodiment, the planarization layer 13 is formed of an organic material by a PFA process, and for example, may be an organic insulating film.

Figure 3:
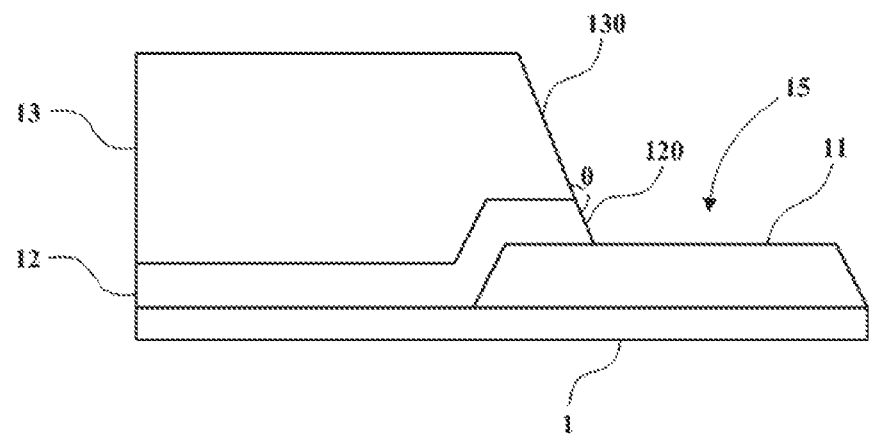
FIG. 3 is a schematic structural diagram of an array substrate according to an embodiment of the present invention.
Figure 4:
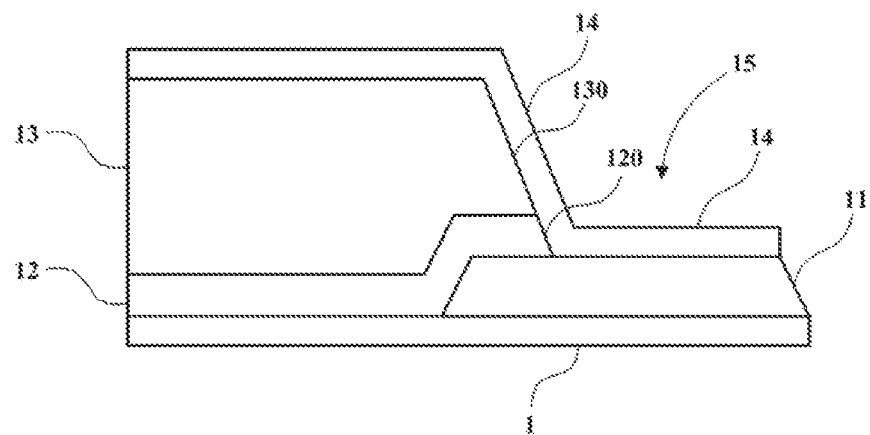
FIG. 4 is another schematic structural diagram of an array substrate according to an embodiment of the present invention.

FIG. 3 shows a schematic view of the hole wall 120 of the contact hole 15 at the passivation layer 12 and the hole wall 130 at the planarization layer 13 in the same plane, that mears the angle θ formed by the hole wall 120 of the contact hole 15 at the passivation layer 12 and the hole wall 130 at the planarization layer 13 is 180°. FIG. 4 is a schematic structural view of the pixel electrode layer 14 formed on the planarization layer 13 and the contact hole 15, correspondingly. Since the hole wall at the planarization layer 13 is coplanar with the hole wall 120 at the passivation layer 12, the front end of the hole wall 130 at the planarization layer 13 is not suspended and forms the undercut, so that the pixel electrode layer 14 is not cracked when the pixel electrode layer 14 is deposited.

Figure 5:
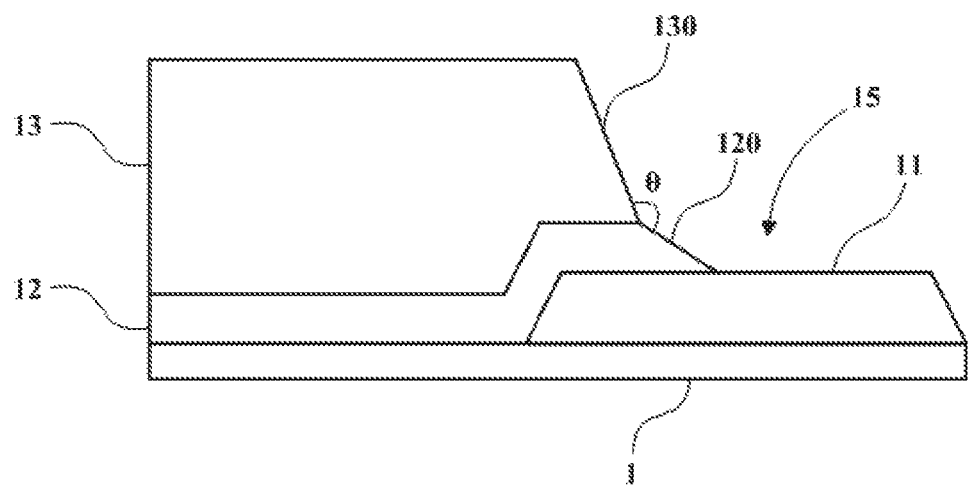
FIG. 5 is a schematic diagram of another structure of an array substrate according to an embodiment of the present invention.
Figure 6:
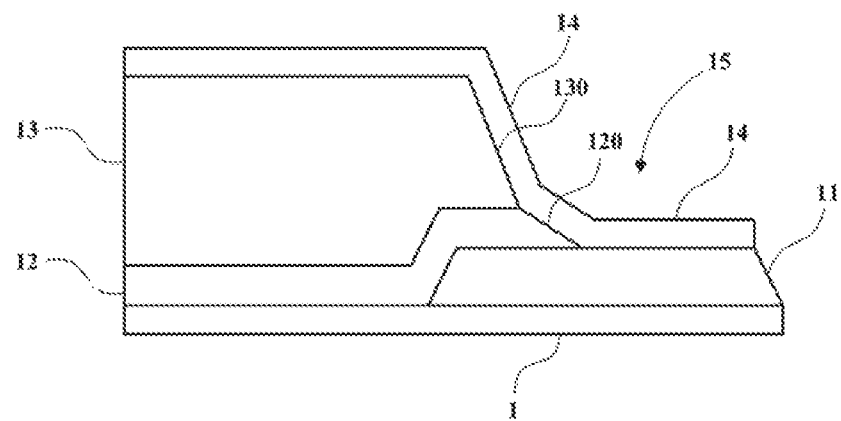
FIG. 6 is still another schematic structural diagram of an array substrate according to an embodiment of the present invention.

FIG. 5 shows a schematic view of the obtuse angle formed by the hole wall 120 of the contact hole 15 at the passivation layer 12 and the hole wall 130 at the planarization layer 13. In combination with the structure shown in FIG. 3, the angle formed by the hole wall 120 of the contact hole 15 at the passivation layer 12 and the hole wall 130 at the planarization layer 13 ranges from (90°, 180°). FIG. 6 is a schematic structural view of the pixel electrode layer 14 deposited on the planarization layer 13 and the contact hole 15 respectively. Since the hole wall at the planarization layer 13 and the hole wall 120 at the passivation layer 12 forms an obtuse angle, the front end of hole wall 130 at the planarization layer 13 does not suspended and forms the undercut, so that the pixel electrode layer 14 is deposited without cracking.

Figure 7:
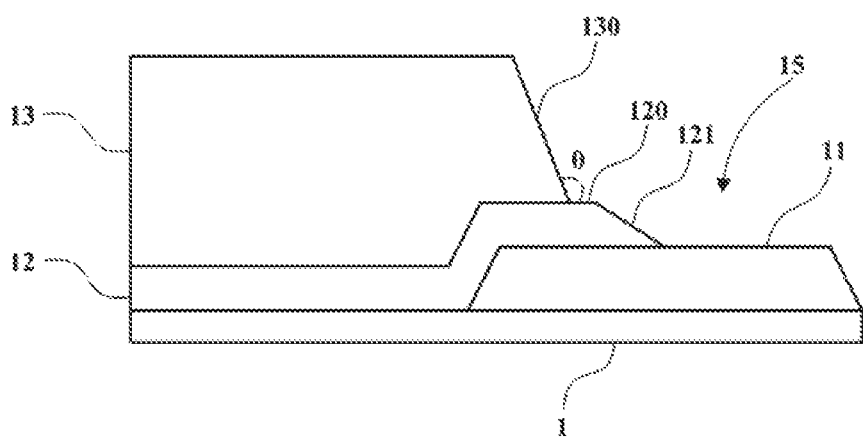
FIG. 7 is still another schematic structural diagram of an array substrate according to an embodiment of the present invention.

Further referring to the illustration in FIG. 7, another embodiment of the hole wall structure at the passivation layer 12 is provided. That is, the hole wall of the contact hole 15 at the passivation layer 12 forms a step, includes a first hole wall 120 with surface parallel to the base substrate 1, and a second hole wall 121 inclined from the first hole wall 120 toward the metal layer 11 and connected to the metal layer 11. The first hole wall 120 and the hole wall 130 of the contact hole 15 at the planarization layer 13 form the obtuse angle θ. Considering the material uniformity of the formation of the passivation layer 12 and the planarization layer 13, and the etching conditions at various points in the panel may have differences, the step structure formed at the passivation layer 12 can ensure a sufficient process window.

In this embodiment, the material of the passivation layer 12 is any one of $SiN_x$, $SiO_x$ and $SiOxN_y$.

Figure 8:
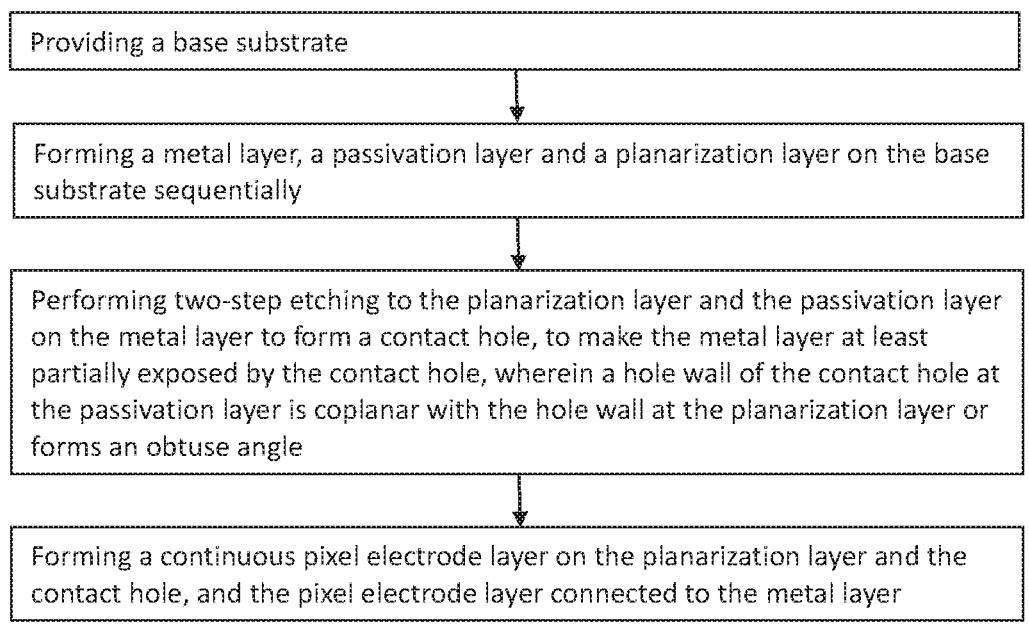
FIG. 8 is a schematic flow chart of a method of making an array substrate according to a second embodiment of the present invention.

Please refer to the illustration of FIG. 8, corresponding to the first embodiment of the present invention, a second embodiment of the present invention provides a method of making the array substrate, including:

Providing a base substrate;

Sequentially forming a metal layer, a passivation layer and a planarization layer on the base substrate;

Etching the planarization layer and the passivation layer on the metal layer in two-step to form a contact hole at least partially exposing the metal layer, the hole wall of the contact hole at the passivation layer is coplanar or forms an obtuse angle with the hole wall at the planarization layer;

Forming a continuous pixel electrode layer on the planarization layer and the contact hole, and the pixel electrode layer is connected to the metal layer.

Specifically, the etching of the planarization layer and the passivation layer on the metal layer in this embodiment is performed in two-step. In the first step, the etching rate selectivity of the planarization layer to the passivation layer is less than the etching rate selectivity of the planarization layer to the passivation layer in the second step, that is: The first step is to etch more passivation layers and fewer planarization layers, the second step is to etch the remaining passivation layers and more planarization layers, so that to make the hole wall 130 of the contact hole formed at the planarization layer 13 does not protrude from the hole wall 120 at the passivation layer 12, and the front end of the hole wall 130 at the planarization layer 13 does not become suspended and forms the undercut, but the hole wall 120 at the planarization layer 12 is in the same plane or forms the obtuse angle θ (as shown in FIG. 3). The deposition of the pixel electrode layer 14 on the planarization layer 13 and the continuous hole wall along the contact hole 15 thereafter, no crack occurs due to the lack of the undercut in the conventional technology.

It should be noted that, if one step etching is used to avoid the undercut, the etching of the planarization layer needs to be accelerated, and the etching of the passivation layer is slow down. In this way, in order to ensure that the passivation layer is etched cleanly, it will inevitably increase the time, and affect the productivity. On the other hand, accelerating the etching of the planarization layer, that is, increasing the etching rate of the planarization layer will inevitably reduce the final remaining amount of the planarization layer. When the remaining amount of the planarization layer is insufficient, it is easy to cause the contamination caused by the contact of the RGB color resist and the liquid crystal, which may affect the product quality. Therefore, in the embodiment of the present invention, the two-step etching is used, and in the first step, the etching rate selectivity of the planarization layer to the passivation layer is smaller than the etching rate selectivity of the planarization layer to the passivation layer in the second step, on the basis of ensuring the clean etching of the passivation layer, the contradiction between the remaining amount of the planarization layer and the undercut is solved.

In this embodiment, the material of the passivation layer 12 is any one of $SiN_x$, $SiO_x$ and $SiO_xN_y$. In addition, the embodiment of the present invention does not limit the metal layer 11. The metal layer 11 may be formed by patterning to form the source or the drain and be connected with the pixel electrode at the contact hole 15.

Further, in the first step of etching, the range of the etching rate selectivity of the planarization layer to the passivation layer is [0.8, 1]. Taking the planarization layer as the organic insulating film and the passivation layer as $SiN_x$ as an example, that is, the organic insulating film: $SiN_x$=0.8~1, to etch most amount of $SiN_x$, a small amount of the organic insulating film; in the second step of etching, the etching rate selectivity of the planarization layer to the passivation layer is selected as [1.8, 2], that is, the organic insulating film: $SiN_x$=1.8~2, to etch the remaining $SiN_x$ and etch most of the organic insulating film to ensure that the hole wall 130 of the contact hole 15 formed at the planarization layer 13 does not protrude in the hole wall 120 at the planarization layer 12, the front end of the hole wall 130 at the planarization layer 13 do not suspended to form the undercut. It can be understood that, in this embodiment, the etching rate refers to the etched film thickness in unit time, for example, the etching rate of the planarization layer is 800 A/min, indicating that the thickness of the etched planarization layer is 800 angstroms per minute; the etching rate of the passivation layer is 1000 A/min, indicating that the thickness of the etched passivation layer is 1000 angstroms per minute. The etching rate selectivity of the planarization layer and the passivation layer is the ratio of the etching rate of the planarization layer to the etching rate of the passivation layer. By controlling the etching time of each step, according to the etching rate selectivity above, to make the thickness of the etched planarization layer and the etched passivation layer is controlled at 1.2 to 1.5.

Further, in this embodiment, the adjustment of etching time can be used to cope with different film materials of the passivation layers and planarization layers. The film quality affects the etching rate. For example, when the $SiN_x$ film becomes dense, the etching rate will become slow. As mentioned above, in the first step of etching, the etching rate of $SiN_x$ is relatively fast, so the etching time can be properly increased in the first step to etch more $SiN_x$, to ensure the etching effect. Another example is the replacement of the material of the planarization layer, resulting in faster etching rate, as also mentioned earlier, in the second step of etching, the etching rate of the planarization layer is relatively faster, so the etching time can be appropriately reduced in the second step to avoid excessive etching of the planarization layer, to ensure the etching effect. Similarly, if the passivation layer is made of a looser film, then the first step of the etching time is reduced; if the material of the planarization layer is selected slower etching rate, then increase the etching time of the second step.

It can be seen from the above description that the embodiments of the present invention have the following beneficial effects; by performing two-step etching to the planarization layer and the passivation layer on the metal layer, to make the hole wall of the contact hole at the passivation layer and the hole wall at the planarization layer forming the obtuse angle, so as to solve the problem that the pixel electrode layer is cracked due to undercut in the conventional technology. On the basis of ensuring that the passivation layer at the contact hole is etched cleanly, a relatively small planarization layer is etched away to avoid the contamination caused by the contact of the RGB color resist and the liquid crystal; In addition, but also through the two-step etching time to deal with the different passivation film quality and the material of the planarization layer.

The foregoing contents are detailed description of the disclosure in conjunction with specific preferred embodiments and concrete embodiments of the disclosure are not limited to these descriptions. For the person skilled in the art of the disclosure, without departing from the concept of the disclosure, simple deductions or substitutions can be made and should be included in the protection scope of the application.

What is claimed is:

1. An array substrate, comprising:
   a base substrate;

a metal layer formed on the base substrate;

a passivation layer formed on the base substrate and the metal layer;

a planarization layer formed on the passivation layer;

a contact hole formed by two-step etching the planarization layer and the passivation layer on the metal layer, to make the metal layer at least partially exposed by the contact hole, wherein a hole wall of the contact hole at the passivation layer and a hole wall at the planarization layer form an obtuse angle greater than 90 degrees and less than 180 degrees, the hole wall of the contact hole at the passivation layer is inclined starting from a contact interface between the planarization layer and the passivation layer until another contact interface between the passivation layer and the metal layer; and a continuous pixel electrode layer formed on the planarization layer and the contact hole, wherein the pixel electrode layer is connected to the metal layer, and portions of the continuous pixel electrode layer on the hole wall of the contact hole at the planarization layer and the hole wall of the contact hole at the passivation layer respectively as a whole is bended in shape.

2. The array substrate according to claim 1, wherein a material of the passivation layer is one of $SiN_x$, $SiO_x$, and $SiO_xN_y$.

* * * * *